United States Patent
Yan et al.

(10) Patent No.: US 11,703,978 B2
(45) Date of Patent: Jul. 18, 2023

(54) TOUCH SUBSTRATE AND TOUCH DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Jun Yan, Beijing (CN); Lingran Wang, Beijing (CN); Xiangdan Dong, Beijing (CN); Bo Cheng, Beijing (CN); Fan He, Beijing (CN); Mengmeng Du, Beijing (CN); Bo Zhang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 540 days.

(21) Appl. No.: 16/971,207

(22) PCT Filed: Oct. 29, 2019

(86) PCT No.: PCT/CN2019/114042
§ 371 (c)(1),
(2) Date: Aug. 19, 2020

(87) PCT Pub. No.: WO2021/081760
PCT Pub. Date: May 6, 2021

(65) Prior Publication Data
US 2022/0382432 A1    Dec. 1, 2022

(51) Int. Cl.
*G06F 3/041* (2006.01)
*G06F 3/044* (2006.01)
*H10K 59/40* (2023.01)

(52) U.S. Cl.
CPC ........ *G06F 3/04164* (2019.05); *G06F 3/0446* (2019.05); *G06F 2203/04107* (2013.01); *G06F 2203/04111* (2013.01); *H10K 59/40* (2023.02)

(58) Field of Classification Search
None
See application file for complete search history.

(56) References Cited

U.S. PATENT DOCUMENTS

2012/0146919 A1    6/2012  Kim et al.
2017/0123572 A1*   5/2017  Song ..................... G06F 3/0446
(Continued)

FOREIGN PATENT DOCUMENTS

CN    102081484 A    6/2011
CN    108806513 A    11/2018
(Continued)

OTHER PUBLICATIONS

International Search Report of PCT/CN2019/114042 in Chinese, dated Aug. 3, 2020.
(Continued)

*Primary Examiner* — Amare Mengistu
*Assistant Examiner* — Sarvesh J Nadkarni
(74) *Attorney, Agent, or Firm* — Collard & Roe, P.C.

(57) ABSTRACT

A touch substrate and a touch display device are provided. The touch substrate includes a rounded-corner region, a touch-driving connection line connected with each first rounded-corner touch electrode, and a touch-sensing connection line connected with each second rounded-corner touch electrode, the touch-sensing connection line includes a first U-shaped bent portion and a first extension portion extending in a second direction, the first U-shaped bent portion includes a first bent portion, a second bent portion, and a first connection portion, the first bent portion is electrically connected with the second rounded-corner touch
(Continued)

electrode, the second bent portion is connected with the first extension portion, and the first connection portion connects the first bent portion with the second bent portion, the first connection portion and the touch-driving connection line are arranged in different layers.

19 Claims, 5 Drawing Sheets

(56) References Cited

U.S. PATENT DOCUMENTS

| | | | |
|---|---|---|---|
| 2018/0040291 A1* | 2/2018 | Wu | G09G 3/2092 |
| 2018/0348906 A1 | 12/2018 | Hwang et al. | |
| 2020/0050311 A1* | 2/2020 | Rhe | G06F 3/0412 |
| 2020/0057530 A1* | 2/2020 | Moon | G06F 3/0412 |
| 2020/0117313 A1* | 4/2020 | Zhang | G06F 3/0446 |
| 2020/0278771 A1* | 9/2020 | Keefer | H05K 3/00 |
| 2020/0301544 A1* | 9/2020 | Jeong | G06F 3/0443 |

FOREIGN PATENT DOCUMENTS

| | | |
|---|---|---|
| CN | 109885200 A | 6/2019 |
| CN | 110308823 A | 10/2019 |

OTHER PUBLICATIONS

Notice of Transmittal of the International Search Report of PCT/CN2019/114042 in Chinese, dated Aug. 3, 2020.
Written Opinion of the International Searching Authority of PCT/CN2019/114042 in Chinese, dated Aug. 3, 2020.
Extended European Search Report in European Application No. 19945417.4 dated Oct. 7, 2022.

* cited by examiner

TOUCH SUBSTRATE AND TOUCH DISPLAY DEVICE

CROSS REFERENCE TO RELATED APPLICATIONS

This application is the National Stage of PCT/CN2019/114042 filed on Oct. 29, 2019, the disclosure of which is incorporated by reference.

TECHNICAL FIELD

Embodiments of the present disclosure relates to a touch substrate and a touch display device.

BACKGROUND

With the continuous development of touch technology, smart electronic products such as mobile phones and tablet computers are integrated with touch substrates with touch functions. On the other hand, with the development of the market, smart electronic products such as mobile phones and tablet computers gradually adopt designs of narrow bezel or even bezel less, that is, "full screen" design, so as to provide a better experience for users.

SUMMARY

At least one embodiment of the present disclosure relates to a touch substrate and a touch display device. The touch substrate adopts a bridge-connection design in the rounded-corner region to connect a second rounded-corner touch electrode extending into the rounded-corner region with a first extension portion of a corresponding touch-sensing connection line. Besides, the touch substrate can also prevent signal interference between the touch-sensing connection line and the touch-driving connection line by providing a shielding line, so as to avoid affecting the touch performance.

At least one embodiment of the present disclosure provides a touch substrate, which includes a base substrate; a plurality of first touch electrodes disposed on the base substrate and arranged in a first direction; and a plurality of second touch electrodes disposed on the base substrate and arranged in a second direction, the touch substrate includes a touch region and a peripheral region located at a periphery of the touch region, and the touch region includes a rounded-corner region, the plurality of first touch electrodes include at least one first rounded-corner touch electrode extending into the rounded-corner region, the touch substrate further includes a touch-driving connection line connected with each of the at least one first rounded-corner touch electrode, the plurality of second touch electrodes include at least one second rounded-corner touch electrode extending into the rounded-corner region, the touch substrate further includes a touch-sensing connection line connected with each of the at least one second rounded-corner touch electrode, the touch-sensing connection line includes a first U-shaped bent portion and a first extension portion extending in the second direction, the first U-shaped bent portion includes a first bent portion, a second bent portion, and a first connection portion, the first bent portion is electrically connected with the second rounded-corner touch electrode and located at a side of the touch-driving connection line close to the touch region, the second bent portion is connected with the first extension portion and located at a side of the touch-driving connection line away from the touch region, and the first connection portion connects the first bent portion with the second bent portion, and the first connection portion and the touch-driving connection line are overlapped with each other in a direction perpendicular to the base substrate, and, in an overlap region of the first connection portion and the touch-driving connection line, the first connection portion and the touch-driving connection line are arranged in different layers.

For example, in the touch substrate provided by an embodiment of the present disclosure, the touch-sensing connection line further includes: an interconnection line electrically connecting the first bent portion and the second rounded-corner touch electrode.

For example, the touch substrate provided by an embodiment of the present disclosure further includes a first shielding line, including a second U-shaped bent portion and a second extension portion, the second U-shaped bent portion includes a third bent portion located between the first bent portion and the touch-driving connection line, a fourth bent portion located at a side of the touch-driving connection line away from the first bent portion, and a second connection portion connecting the third bent portion with the fourth bent portion, the second connection portion and the touch-driving connection line are overlapped with each other and are insulated from each other, and the second U-shaped bent portion is located in a region enclosed by the first bent portion, the second bent portion, and the first connection portion, the first connection portion and the second connection portion are substantially parallel with each other, the second U-shaped bent portion and the first U-shaped bent portion have a same opening direction.

For example, the touch substrate provided by an embodiment of the present disclosure further includes a second shielding line, an orthographic projection of the second shielding line on the base substrate is located between an orthographic projection of the first shielding line on the base substrate and an orthographic projection of the second bent portion on the base substrate.

For example, in the touch substrate provided by an embodiment of the present disclosure, the first bent portion is substantially parallel with an outer edge of the rounded-corner region, and the second bent portion is substantially parallel with an outer edge of the rounded-corner region.

For example, in the touch substrate provided by an embodiment of the present disclosure, the touch-driving connection line includes a first touch-driving connection sub-line located at a side of the second connection portion away from the first connection portion and a second touch-driving connection sub-line located at a side of the first connection portion away from the second connection portion, and the touch substrate further includes a bridge portion connecting the first touch-driving connection sub-line with the second touch-driving connection sub-line.

For example, in the touch substrate provided by an embodiment of the present disclosure, the first shielding line further includes: a third extension portion extending substantially in the second direction; a third connection portion arranged in a layer different from the first connection portion; a first through-hole connection portion connecting the third connection portion with the third extension portion; and a second through-hole connection portion connecting the third connection portion with the fourth bent portion, the third connection portion is located in a first conductive layer, the third extension portion and the fourth bent portion are located in a second conductive layer, and an insulation layer is provided between the first conductive layer and the second conductive layer, and the first through-hole connection portion and the second through-hole connection portion are provided in the insulation layer.

For example, in the touch substrate provided by an embodiment of the present disclosure, an orthographic projection of the third connection portion on the base substrate is overlapped with an orthographic projection of the fourth bent portion on the base substrate and an orthographic projection of the third extension portion on the base substrate, respectively.

For example, in the touch substrate provided by an embodiment of the present disclosure, the bridge portion includes: a fourth connection portion arranged in a layer different from the first connection portion; a third through-hole connection portion connecting the fourth connection portion with the first touch-driving connection sub-line; and a fourth through-hole connection portion connecting the four connection portion with the second touch-driving connection sub-line, the fourth connection portion is located in the first conductive layer, the first touch-driving connection sub-line and the second touch-driving connection sub-line are located in the second conductive layer, and an insulation layer is provided between the first conductive layer and the second conductive layer, and the third through-hole connection portion and the fourth through-hole connection portion are arranged in the insulation layer.

For example, in the touch substrate provided by an embodiment of the present disclosure, an orthographic projection of the fourth connection portion on the base substrate is overlapped with an orthographic projection of the first touch-driving connection sub-line on the base substrate and an orthographic projection of the second touch-driving connection sub-line on the base substrate, respectively.

For example, in the touch substrate provided by an embodiment of the present disclosure, a center of the second through-hole connection portion and a center of the third through-hole connection portion are staggered in the second direction.

For example, the touch substrate provided by an embodiment of the present disclosure further includes: a ground line located at a side of the second bent portion away from the touch region.

For example, in the touch substrate provided by an embodiment of the present disclosure, the base substrate is a cover plate of a display panel or an encapsulation layer of a display panel.

For example, in the touch substrate provided by an embodiment of the present disclosure, the first touch electrode is a touch-driving electrode, and the second touch electrode is a touch-sensing electrode.

For example, the touch substrate provided by an embodiment of the present disclosure further includes: a bonding region, the rounded-corner region is located at a corner of the touch region close to the bonding region.

At least one embodiment of the present disclosure provides a touch display device, including the abovementioned touch substrate.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

Figure 1:
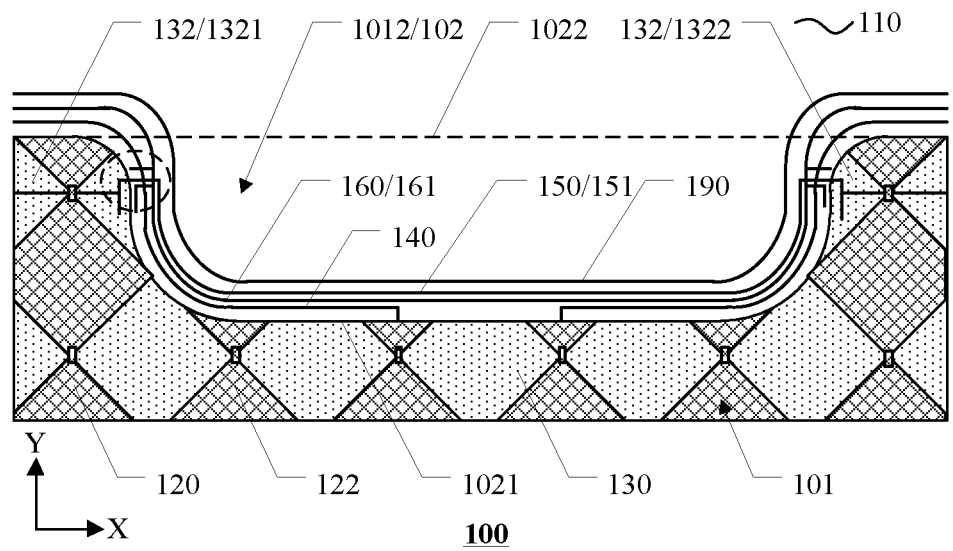
FIG. 1 is a schematic plan view of a touch substrate provided by an embodiment of the present disclosure.

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "include," "including," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

At present, in order to retain a front camera or other sensors while increasing a screen-to-body ratio, a notch is required at an upper edge of the touch substrate. In this way, a notched region is formed due to the notch is provided at the upper edge of the touch substrate, and a touch electrode pattern will be separated at the notched region as mentioned above, a particular design is required to connect parts of the touch electrode at both sides of the notched region, and to reasonably arrange lines (wires) of the touch electrodes.

On the other hand, the touch substrate usually adopts a rounded corner, and a touch-sensing electrode will be cut at a position of the rounded corner. As a result, the touch electrode at the position of the rounded corner needs to be connected with a corresponding connection line of the touch electrode by a bridge.

In this regard, embodiments of the present disclosure provide a touch substrate and a touch display device. The touch substrate includes: a base substrate; a plurality of first touch electrodes disposed on the base substrate and arranged in a first direction; a plurality of second touch electrodes disposed on the base substrate and arranged in a second direction; the touch substrate includes a touch region and a notched region located at an edge of the touch region in the second direction, the plurality of first touch electrodes include at least one first notch touch electrode extending towards the notched region, the touch substrate further includes a touch-driving connection line connected with each of the at least one first notch touch electrode, the plurality of second touch electrodes includes at least one second separated touch electrode separated at the notched region, and each second separated touch electrode includes a first sub-portion and a second sub-portion located at both sides of the notched region, respectively. The touch substrate further includes a bridge line that extends along an edge of the notched region close to the touch region and connects the first sub-portion with the second sub-portion. At least one touch-driving connection line extends along the edge of the notched region close to the touch region and extends to an edge of the notched region away from the touch region. The touch substrate further includes a shielding line, an orthographic projection of the shielding line on the base substrate is located between an orthographic projection of the bridge line on the base substrate and an orthographic projection of the touch-driving connection line on the base substrate. The touch substrate can electrically connect the first sub-portion with the second sub-portion that are of the second separated touch electrode and are separated at the notched region by arranging the above-mentioned bridge line; on the other hand, in the touch substrate, by providing a shielding line between the bridge line and the touch-driving connection line, a signal interference between the bridge line and the touch-driving connection line can be prevented, so as not to affect the touch performance.

On the other hand, the embodiments of the present disclosure further provide a touch substrate and a touch display device. The touch substrate includes a base substrate; a plurality of first touch electrodes disposed on the base substrate and arranged in a first direction; and a plurality of second touch electrodes disposed on the base substrate and arranged in a second direction; the touch substrate includes a touch region and a peripheral region located at a periphery of the touch region, and the touch region includes a rounded-corner region, the plurality of first touch electrodes include at least one first rounded-corner touch electrode extending into the rounded-corner region, the touch substrate further includes a touch-driving connection line connected with each of the at least one first rounded-corner touch electrode, the plurality of second touch electrodes include at least one second rounded-corner touch electrode extending into the rounded-corner region, the touch substrate further includes a touch-sensing connection line connected with each of the at least one second rounded-corner touch electrode, the touch-sensing connection line includes a first U-shaped bent portion and a first extension portion extending in the second direction, the first U-shaped bent portion includes a first bent portion, a second bent portion, and a first connection portion, the first bent portion is electrically connected with the second rounded-corner touch electrode and located at a side of the touch-driving connection line close to the touch region, the second bent portion is connected with the first extension portion and located at a side of the touch-driving connection line away from the touch region, and the first connection portion connects the first bent portion with the second bent portion, and the first connection portion and the touch-driving connection line are overlapped with each other in a direction perpendicular to the base substrate, and the first connection portion and the touch-driving connection line are arranged in different layers in an overlap region of the first connection portion and the touch-driving connection line. Therefore, the touch substrate adopts a bridge in the rounded-corner region to connect the second rounded-corner touch electrode extending into the rounded-corner region with the first extension of a corresponding touch-sensing connection line.

Hereinafter, the touch substrate and the touch display device provided by the embodiments of the present disclosure will be described in detail with reference to the accompanying drawings.

Figure 2:
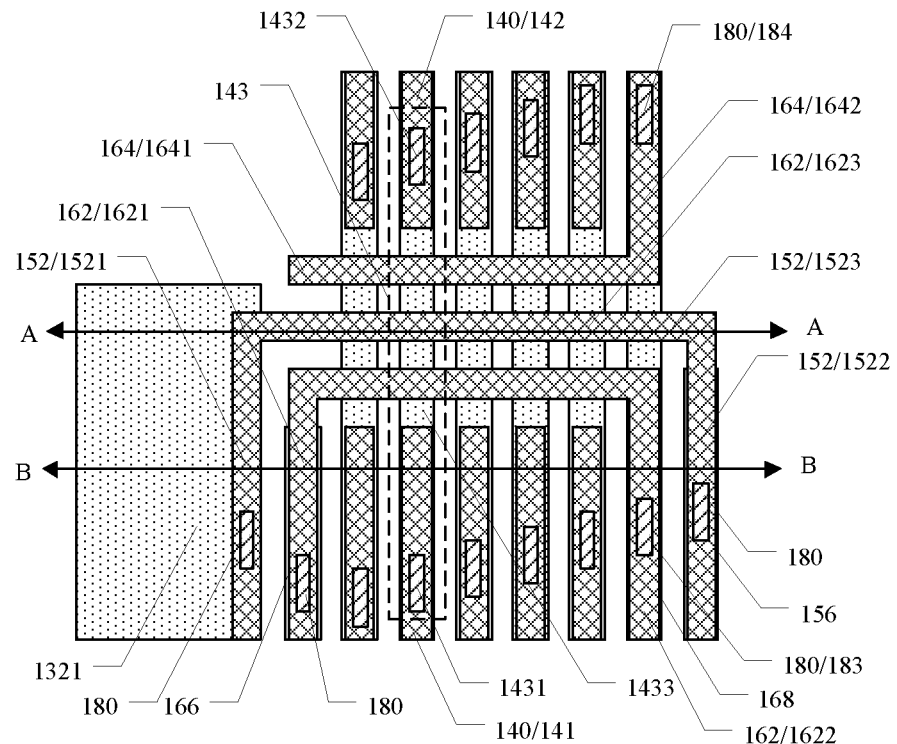
FIG. 2 is a schematic enlarged diagram of a touch substrate illustrated in FIG. 1 at a region enclosed by a dashed line and provided by an embodiment of the present disclosure.

FIG. 1 is a schematic plan view of a touch substrate provided by an embodiment of the present disclosure; FIG. 2 is an enlarged schematic view of a touch substrate illustrated in FIG. 1 and provided by an embodiment of the present disclosure at a position enclosed by a dashed line. As illustrated in FIG. 1 and FIG. 2, the touch substrate 100 includes a base substrate 110, and a plurality of first touch electrodes 120 and a plurality of second touch electrodes 130 that are disposed on the base substrate 110. The plurality of first touch electrodes 120 are arranged in a first direction X; the plurality of second touch electrodes 130 are arranged in a second direction Y. The touch substrate 100 includes a touch region 101 and a notched region 102 located at an edge 1012 of the touch region 101 in the second direction Y, and the plurality of first touch electrodes 120 include at least one first notch touch electrode 122 extending towards the notched region 102, the touch substrate 100 further includes a touch-driving connection line 140 connected with each first notch touch electrode 122. For example, FIG. 1 illustrates four first notch touch electrodes 122. It should be explained that the first notch touch electrode 122 refers to the first touch electrode 120 that extends from the touch region 101 towards the notched region 102 in the second direction; for simplicity, FIG. 1 only illustrates two touch-driving connection line, each of the first notch touch electrodes of the touch substrate provided by the embodiment of the present disclosure can be connected with a touch-driving connection line. It should be explained that each first touch electrode is a touch electrode extending in the second direction, and the plurality of first touch electrodes are arranged in the first direction; each second touch electrode is a touch electrode extending in the first direction, and the plurality of second touch electrodes are arranged in the second direction. In addition, the first direction and the second direction as mentioned above are two directions located in a plane of the touch substrate and are intersected with each other, for example, are perpendicular to each other.

As illustrated in FIG. 1 and FIG. 2, the plurality of second touch electrodes 130 include at least one second separated touch electrode 132 that is separated at the notched region 102, and each second separated touch electrode 132 includes a first sub-portion 1321 and a second sub-portion 1322 that are located at both sides of the notched region 102, respectively. The touch substrate 100 further includes a bridge line 150, which extends at least partially along an edge 1021 of the notched region 102 close to the touch region 101 and connects the first sub-portion 1321 with the second sub-portion 1322, and at least one touch-driving connection line 140 extends along the edge 1021 of the notched region 102 close to the touch region 101 and extends to an edge 1022 of the notched region 102 away from the touch region 101. The touch substrate 100 further includes a shielding line (guard line) 160, an orthographic projection of at least a part of the shielding line 160 on the base substrate 110 is located between orthographic projections of the bridge line 150 and the touch-driving connection line 140 on the base substrate 110. It should be explained that the above-mentioned first touch electrode may be a touch-driving electrode, and the above-mentioned second touch electrode may be a touch-sensing electrode; of course, the embodiments of the present disclosure include, but are not limited thereto, the above-mentioned first touch electrode may also be a touch-sensing electrode, and the above-mentioned second touch electrode may also be a touch-driving electrode.

The touch substrate provided by this embodiment can enable the first sub-portion and the second sub-portion of the second separated touch electrode that are separated at the notched region to be electrically connected by providing the bridge line mentioned above. On the other hand, the touch substrate can prevent from signal interference between the bridge line and the touch-driving connection line by providing a shielding line between the bridge line and the touch-driving connection line, thereby avoiding an influence on touch performance.

It should be noted that, the touch-driving connection line and the bridge line are adjacent to each other, and a TX signal on the touch-driving connection line and a RX signal on the bridge line have a potential difference. Due to the existence of coupling capacitance, the problem of the TX signal charge escape will be caused, and then the signal-to-noise ratio will be reduced. In the present disclosure, the shielding line (guard line) is provided between the touch-driving connection line and the bridge line, and the shielding line can be applied with a guard signal, the guard signal is an AC signal (square wave), which is the same as the TX signal applied to the touch-driving connection line. In this way, the potential difference between TX signal and guard signal is always 0, so the signal-to-noise ratio is prevented from being reduced due to charge escape distortion, which plays a role in shielding interference and improving the signal-to-noise ratio.

In some exemplary embodiments, as illustrated in FIG. 1, because three sides of the notched region are all surrounded by the touch region, the edge 1021 of the above notched region 102 close to the touch region 101 is the three sides of the notched region 102 surrounded by the touch region 101. That is, the notched region 102 is surrounded only by the edge 1021 of the notched region 102 close to the touch region 101 and the edge 1022 of the notched region 102 away from the touch region 101.

For example, as illustrated in FIG. 1, the touch region 101 and the notched region 102 of the touch substrate 100 may constitute a rectangular region. For example, as illustrated in FIG. 1, a shape of the notched region 102 may be a rounded rectangle with two rounded corners close to the touch region 101.

For example, as illustrated in FIG. 1, the first touch electrode 120 and the second touch electrode 130 may be made of the same conductive layer. For example, the second touch electrode 130 may be a continuous electrode extending in the first direction, and the first touch electrode 120 may include a plurality of block-shaped electrodes separated by the second touch electrodes 130 and an electrode bridged structure configured to connect adjacent block-shaped electrodes. Of course, the embodiments of the present disclosure include but are not limited thereto, and a layout of the first touch electrode and the second touch electrode may refer to a common design.

For example, the first touch electrode 120 and the second touch electrode 130 may be made of a metal material, or a conductive metal oxide such as indium tin oxide.

For example, as illustrated in FIG. 1, the touch substrate 100 further includes: a ground line 190 located at a side of the bridge line 150 away from the touch region 101.

In some exemplary embodiments, as illustrated in FIG. 2, the bridge line 150 includes a bridge main body portion 151 and first U-shaped bent portions 152 located at both ends of the bridge main body portion 151, respectively; the first U-shaped bent portion 152 is electrically connected with the first sub-portion 1321 or the second sub-portion 1322. The first U-shaped bent portion 152 includes a first bent portion 1521 extending substantially in the second direction, a second bent portion 1522 extending substantially in the second direction, a first bent portion 1522 extending substantially in the first direction, and a first connection portion 1523 that extends substantially in the first direction the portion 1521 and connects the first bent portion 1521 with the second bent portion 1522, the first bent portion 1521 is electrically connected with the first sub-portion 1321 or the second sub-portion 1322. In other words, a portion of the bridge line 150 that is electrically connected with the first sub-portion 1321 or the second part 1322 is the first U-shaped bent portion 152. The first bent portion 1521 can enhance stability of a connection between the bridge line 150 and the first sub-portion 1321 or between the bridge line 150 and the second sub-portion 1322, and reduce a connection resistance. It should be explained that the aforementioned "extending substantially in the second direction" includes the case of strictly extending in the second direction, and also the case where an angle between the extending direction and the second direction is less than or equal to 45 degrees.

In some exemplary embodiments, as illustrated in FIG. 1 and FIG. 2, an orthographic projection of the first bent portion 152 on the base substrate 110 is at least partially overlapped with an orthographic projection of the first sub-portion 1321 or the second sub-portion 1322 on the base substrate 110.

In some exemplary embodiments, as illustrated in FIG. 1 and FIG. 2, the two first U-shaped bent portions 152 located at both ends of the bridge line 150 are axially symmetrical with respect to a perpendicular bisector of the bridge line 150. For example, as illustrated in FIG. 2, the first sub-portion 1321 or the second sub-portion 1322 of the second separated touch electrode 132 is arranged in a layer different from the first bent portion 1521. An insulation layer (not illustrated in FIG. 2) may be provided between the first sub-portion 1321 and the first bent portion 1521 or between the second sub-portion 1322 and the first bent portion 1521. In this case, the first sub-portion 1321 or the second sub-portion 1322 can be electrically connected with the first bent portion 1521 by a connection via structure 180. It should be explained that the connection via structure 180 may include a via hole in the insulation layer and a conductive structure in the via hole. A structure of the connection via structure is not particularly limited in the embodiments of the present disclosure.

In some exemplary embodiments, as illustrated in FIG. 2, the second bent portion 1522 connected with the bridge main body portion 151 may include two portions that are located in a first conductive layer and a second conductive layer respectively and are electrically connected with each other. Similarly, the bridge main body portion 151 also includes two portions that are located in a first conductive layer and a second conductive layer respectively and are electrically connected with each other, that is, the bridge main body portion 151 may have a double-layer structure.

In some exemplary embodiments, as illustrated in FIG. 2, in the case where the bridge line 150 includes the first U-shaped bent portion 152, the shielding line 160 includes a shielding main body portion 161 and second U-shaped bent portions 162 located at both ends of the shielding main body portion 161. The second U-shaped bent portion 162 includes a third bent portion 1621 that extends substantially in the second direction, a fourth bent portion 1622 that extends substantially in the second direction, and a fourth bent portion 1622 that extends substantially in the first direction and a second connection portion 1623 that extends substantially in the first direction and connects the third bent portion 1621 and the fourth bent portion 1622, the second U-shaped bent portion 162 is located at a region enclosed by the first bent portion 1521, the second bent portion 1522 and the first connection portion 1523. The first connection portion 1523 is substantially parallel with the second connection portion 1623. An opening direction of the second U-shaped bent portion 162 and an opening direction of the first U-shaped bent portion 152 are the same. Therefore, in the case where the bridge line 150 includes the first U-shaped bent portion 152, the shielding line 160 provided with the second U-shaped bent portion 162 can better prevent signal interference between the bridge line and the touch-driving connection line, so as not to affect the touch performance.

In some exemplary embodiments, as illustrated in FIG. 2, because the touch-driving connection line 140 extends along the edge 1021 of the notched region 102 close to the touch region 101 and extends to the edge 1022 of the notched region 102 away from the touch region 101, the touch-driving connection line 140 is overlapped with the first U-shaped bent portion 152. In this case, in the region enclosed by the first U-shaped bent portion 152, an orthographic projection of the touch-driving connection line 140 on the base substrate 110 is located between an orthographic projection of the third bent portion 1621 on the base substrate 110 and an orthographic projection of the fourth bent portion 1622 on the base substrate 110, and is overlapped with orthographic projections of the first connection portion 1523 and the second connection portion 1623 on the base substrate 110, respectively. In this way, the third bent portion 1621 of the shielding line 160 can better prevent signal interference between the touch-driving connection line 140 and the first bent portion 1521 of the bridge line 150, and the fourth bent portion of the shielding line 160 1622 can better prevent signal interference between the touch-driving connection line 140 and the second bent portion 1522 of the bridge line 150.

In some exemplary embodiments, as illustrated in FIG. 2, in an overlap region between the touch-driving connection line 140 and the first U-shaped bent portion 152 and an overlap region between the touch-driving connection line 140 and the second U-shaped bent portion 162, the touch-driving connection line 140 includes a first touch-driving connection sub-line 141 and a second touch-driving connection sub-line 142 that are located at both sides of a whole structure consisted of the first connection portion 1523 and the second connection portion 1623. For example, as illustrated in FIG. 2, the touch-driving connection line 140 includes a first touch-driving connection sub-line 141 located at a side of the second connection portion 1623 away from the first connection portion 1523 and a second touch-driving connection sub-line 142 located at a side of the first connection portion 1523 away from the second connection portion 1623. The touch substrate 100 includes a bridge portion 143 connecting the first touch-driving connection sub-line 141 with the second touch-driving connection sub-line 142. Thus, by providing the bridge portion 143, the touch-driving connection line 140 can go across the first connection portion 1523 and the second connection portion 1623, and can effectively prevent from signal interference to touch-driving connection line 140 caused by the first connection portion 1523 and the second connection portion 1623.

In some exemplary embodiments, as illustrated in FIG. 2, the shielding line 160 further includes an L-shaped bent portion 164 located at a side of the first connection portion 1523 away from the second connection portion 1623. The L-shaped bent portion 164 includes a first extension portion 1641 extending substantially in the direction and a second extension portion 1642 that is connected with the first extension portion 1641 and extends substantially in the second direction. The first touch-driving connection sub-line 141 is located at a side of the second connection portion 1623 away from the first connection portion 1523, the first extension portion 1641 is located between the first connection portion 1523 and the second touch-driving connection sub-line 142, and the second extension portion 1642 is substantially parallel with the second touch-driving sub-line 142. Therefore, the L-shaped bent portion 164 can effectively prevent from signal interference between the second touch-driving connection sub-line 142 of the touch-driving connection line 140 and the bridge line 150.

Figure 3:
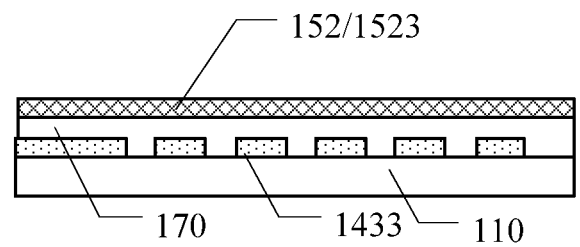
FIG. 3 is a schematic cross-sectional view of a touch substrate illustrated in FIG. 2 taken along line AA and provided by an embodiment of the present disclosure.
Figure 4:
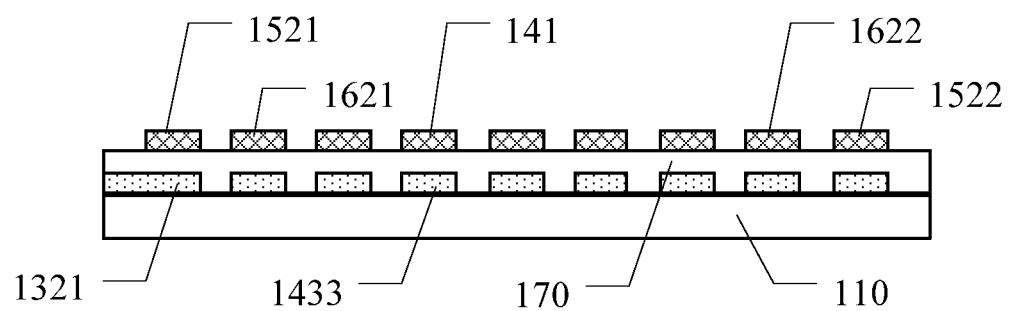
FIG. 4 is a schematic cross-sectional view of a touch substrate illustrated in FIG. 2 taken along line BB and provided by an embodiment of the present disclosure.

FIG. 3 is a schematic cross-sectional view of a touch substrate illustrated in FIG. 2 taken along line AA and provided by an embodiment of the present disclosure. FIG. 4 is a schematic cross-sectional view of a touch substrate illustrated in FIG. 2 taken along line BB and provided by an embodiment of the present disclosure. As illustrated in FIG. 2, FIG. 3, and FIG. 4, the first connection portion 1523 and the second connection portion 1623 may be arranged in the same layer. The bridge portion 143 includes a first through-hole connection portion 1431, a second through-hole connection portion 1432, and a third connection portion 1433. The third connection portion 1433 is arranged in a layer different from the first connection portion 1523, the second connection portion 1623, the first touch-driving connection sub-line 141, and the second touch-driving connection sub-line 142. The first through-hole connection portion 1431 connects the third connection portion 1433 with the first touch-driving connection sub-line 141. The second through-hole connection portion 1432 connects the third connection portion 1433 with the second touch-driving connection sub-line 142. An insulation layer 170 is provided between the third connection portion 1433 and the first connection portion 1523. Due to the insulation effect of the insulation layer 170, a parasitic capacitance of a capacitor formed between the third connection portion 1433 and the first connection portion 1523 is relatively small, so that a signal interference between the third connection portion 1433 and the first connection portion 1523 is weaker, has less influence on touch effect.

In some exemplary embodiments, as illustrated in FIG. 2, FIG. 3, and FIG. 4, the third connection portion 1433 is located in a first conductive layer, that is, the third connection portion 1433 is a part of the first conductive layer. The first touch-driving connection sub-line 141 and the second touch-driving connection sub-line 142 are located in a second conductive layer, that is, the first touch-driving connection sub-line 141 and the second touch-driving connection sub-line 142 are parts of the second conductive layer, respectively. An insulation layer 170 is disposed between the first conductive layer and the second conductive layer, and the first through-hole connection portion 1431 and the second through-hole connection portion 1432 are disposed in the insulation layer 170.

In some exemplary embodiments, as illustrated in FIG. 2, FIG. 3, and FIG. 4, an orthographic projection of the third connection portion 1433 on the base substrate 110 is overlapped with an orthographic projection of the first touch-driving connection sub-line 141 on the base substrate 110 and an orthographic projection of the second touch-driving connection sub-line 142 on the base substrate 110, respectively.

In some exemplary embodiments, as illustrated in FIG. 2, FIG. 3, and FIG. 4, the shielding line 160 further includes: a fourth connection portion 168 that is provided in the same layer as the third connection portion 1433; a third through-hole connection portion 183 that connects the fourth connection portion 168 with the fourth bent portion 1622; and a fourth through-hole connection portion 184 that connects the fourth connection portion 168 with the second extension portion 1642. The fourth connection portion 168 is located in the first conductive layer, and the third bent portion 1621, the second connection portion 1623, the fourth bent portion 1622, the first extension portion 1641, and the second extension portion 1642 are located in the second conductive layer. The third through-hole connection portion 183 and the fourth through-hole connection portion 184 are provided in the insulation layer.

In some exemplary embodiments, as illustrated in FIG. 2, FIG. 3, and FIG. 4, a center of the first through-hole connection portion 1431 and a center of the third through-hole connection portion 183 are staggered in the second direction, that is, an orthographic projection of a center of the first through-hole connection portion 1431 the second direction is not overlapped with an orthographic projection of a center of the third through-hole connection portion 183 on the second direction. Thus, when forming the second through-hole connection portion and the third through-hole connection portion as described above, various defects caused by a small distance between a hole position of the second through-hole connection portion and a hole position of the third through-hole connection portion can be avoided.

In some exemplary embodiments, as illustrated in FIG. 2, FIG. 3, and FIG. 4, an orthographic projection of the fourth connection portion 168 on the base substrate 110 is overlapped with an orthographic projection of the fourth bent portion 1622 on the base substrate 110 and an orthographic projection of the second extension portion 1642 on the base substrate 110, respectively.

In some exemplary embodiments, as illustrated in FIG. 2, FIG. 3 and FIG. 4, the first bent portion 1521, the second bent portion 1522, and the first connection portion 1523 are located in the second conductive layer.

For example, as illustrated in FIG. 4, in the touch substrate, the second separated touch electrode 132 can be formed by a conductive layer, that is, the second touch electrode 130 can be formed by a conductive layer; the aforementioned first U-shaped bent portion 152 and the second U-shaped bent portion 162 may be formed by using another conductive layer. In this case, the bridge line 150 may include a bridge sub-line 156 located at a side of the first connection portion 1523 away from the second connection portion 1623. The bridge sub-line 156 and the second separated touch electrode 132 are arranged in the same layer, and an orthographic projection of the bridge sub-line 156 on the base substrate 110 is at least partially overlapped with an orthographic projection of the second bent portion 1522 on the base substrate 110, and the bridge sub-line 156 and the second bent portion 1522 are electrically connected by the connection via structure 180, thereby reducing a resistance of the bridge line 150. Similarly, the shielding line 160 includes a first bridge sub-line 166 and a second bridge sub-line 168 that are located at a side of the first connection portion 1523 away from the second connection portion 1623, the first sub-bridge line 166 and the second bridge sub-line 168 are arranged in the same layer as the second separated touch electrode 132. The orthographic projection of the first bridge sub-line 166 on the base substrate 110 is at least partially overlapped with the orthographic projection of the third bent portion 1621 on the base substrate 110, and the first bridge sub-line 166 and the third bent portion 1621 are electrically connected by the connection via structure 180, thereby reducing a resistance of the shielding line 160; the orthographic projection of the second bridge sub-line 168 on the base substrate 110 is at least partially overlapped with the orthographic projection of the fourth bent portion 1622 on the base substrate 110, and the second bridge sub-line 168 and the fourth bent portion 1622 are electrically connected by the connection via structure 180, thereby reducing a resistance of the shielding line 160. It should be explained that the aforementioned second bridge sub-line 168 may be a part of the aforementioned fourth connection portion 168. It should be explained that the centers of the above-mentioned connection via structure can all be staggered in the second direction, so as to avoid various defects caused by a small distance between via holes.

For example, as illustrated in FIG. 4, in the touch substrate, the second separated touch electrode 132 may be formed by using the first conductive layer close to the base substrate 110, and the above-mentioned first U-shaped bent portion 152 and second U The bent portion 162 may be formed by using a second conductive layer located on the first conductive layer away from the base substrate 110. In other words, the aforementioned first U-shaped bent portion 152 and the second U-shaped bent portion 162 are located at a side of the second separated touch electrode 132 away from the base substrate. However, the embodiments of the present disclosure include but are not limited thereto. The aforementioned first U-shaped bent portion 152 and the second U-shaped bent portion 162 may also be located at a side of the second separated touch electrode 132 close to the base substrate.

In some exemplary embodiments, the base substrate 110 is a cover plate of a display panel or an encapsulation layer of a display panel. In other words, the display panel may be integrated with the touch substrate, thereby having both touch function and display function.

For example, in the case where the display panel is an organic light-emitting diode (OLED) display panel, the base substrate may be a cover plate or an encapsulation layer of the display panel.

Figure 5:
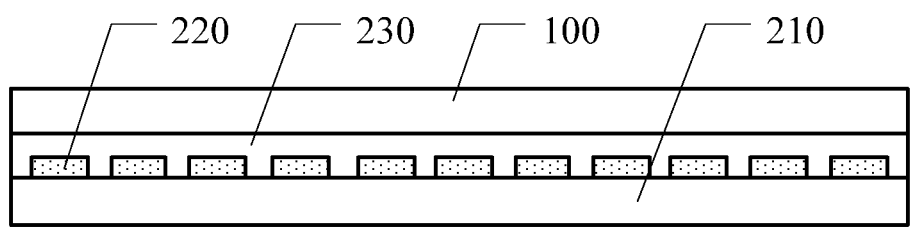
FIG. 5 is a schematic diagram of a touch display device provided by an embodiment of the present disclosure.

An embodiment of the present disclosure further provides a touch display device. FIG. 5 is a schematic diagram of a touch display device provided by an embodiment of the present disclosure. As illustrated in FIG. 5, the touch display device 200 includes the aforementioned touch substrate 100. Therefore, the display device has the same or similar beneficial technical effects as those of the above-mentioned organic light-emitting diode display substrate. For details, please refer to the related description of the embodiment illustrated in FIG. 1 and FIG. 2, without repeated here.

In some exemplary embodiments, the touch display device 200 further includes a substrate 210, a light-emitting element 220 on the substrate 210, and an encapsulation layer 230 at a side of the light-emitting element 220 away from the substrate 210. The aforementioned touch substrate 100 is directly disposed on the encapsulation layer 230, so that a thickness of the touch display device can be reduced, and the touch display device can be made lighter and thinner. On the other hand, by directly disposing the aforementioned touch substrate on the encapsulation layer, the touch display device can also be applicable to foldable and bendable electronic products.

For example, the light-emitting element 220 may be an organic light-emitting diode (OLED) light-emitting element.

In some exemplary embodiments, the notched region 102 is provided with one or more selected from the group consisted of a camera, a speaker, and an infrared sensor, so that the touch display device can achieve a larger screen-to-body ratio.

In some exemplary embodiments, the display device may be an electronic product with a display function such as a mobile phone, a notebook computer, a tablet computer, a navigator, and an electronic photo frame.

Figure 6:
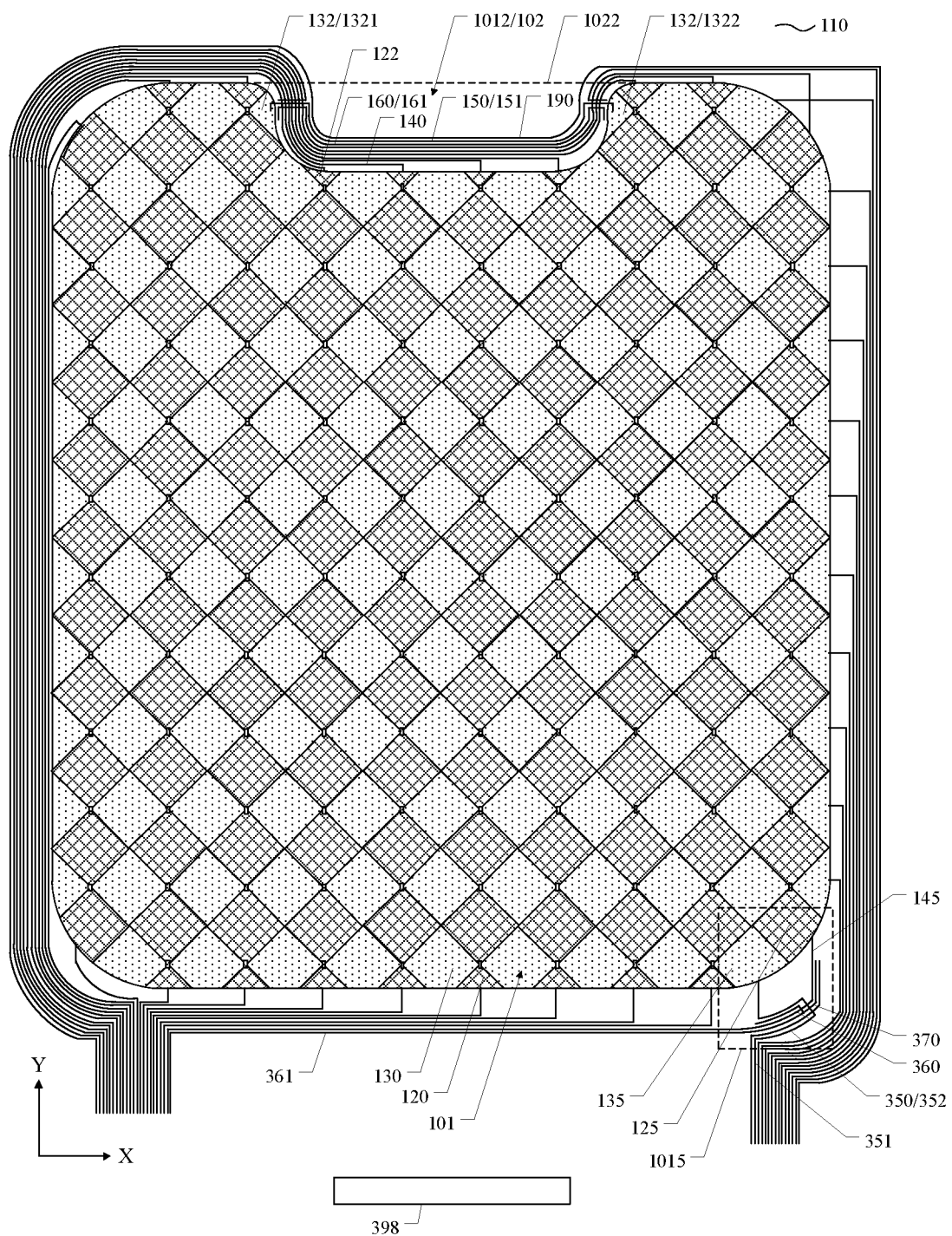
FIG. 6 is a schematic plan view of another touch substrate provided by an embodiment of the present disclosure.
Figure 7:
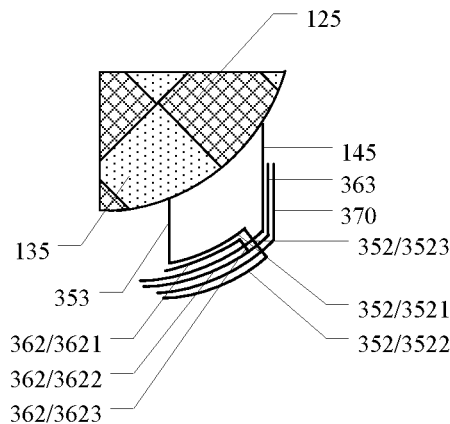
FIG. 7 is a schematic enlarged diagram of a touch substrate illustrated in FIG. 6 at a position of a dashed border and provided by an embodiment of the present disclosure.
Figure 8:
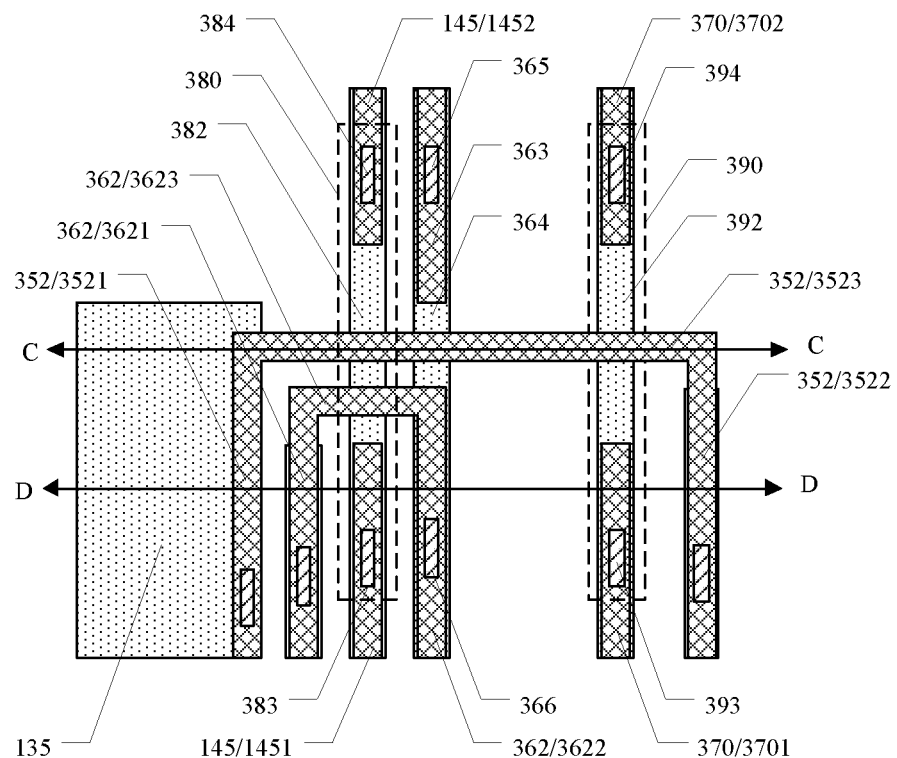
FIG. 8 is a schematic enlarged diagram of another touch substrate illustrated in FIG. 6 at a position of a dashed border and provided by an embodiment of the present disclosure.

FIG. 6 is a schematic plan view of another touch substrate provided by an embodiment of the present disclosure. FIG. 7 is a schematic enlarged diagram of a touch substrate illustrated in FIG. 6 at a position of a dashed border and provided by an embodiment of the present disclosure. FIG. 8 is a schematic enlarged diagram of another touch substrate provided illustrated in FIG. 6 at a position of a dashed border and provided by an embodiment of the present disclosure.

As illustrated in FIG. 6, FIG. 7, and FIG. 8, the touch substrate 300 includes a base substrate 110, and a plurality of first touch electrodes 120 and a plurality of second touch electrodes 130 that are disposed on the base substrate 110. The plurality of first touch electrodes 120 are arranged in the first direction X; the plurality of second touch electrodes 130 are arranged in the second direction Y. The touch substrate 100 includes a touch region 101 and a peripheral region 105 located at a periphery of the touch region 101. The touch region 101 includes a rounded-corner region 1015. The plurality of first touch electrodes 120 include at least one rounded-corner touch electrode 125 extending into the rounded-corner region 1015. The touch substrate 100 further includes a touch-driving connection line 145 connected with each of the at least one first rounded-corner touch electrode 125. The plurality of second touch electrodes 130 include at least one second rounded-corner touch electrode 135 that extends to the rounded-corner region 1015. The touch substrate 100 further includes a touch-sensing connection line 350 connected with each second rounded-corner touch electrode 135. The touch-sensing connection line 350 includes a first U-shaped bent portion 352 and a first extension portion 351 extending substantially in the second direction, the first U-shaped bent portion 352 includes a first bent portion 3521, a second bent portion 3522, and a first connection portion 3523. The first bent portion 3521 is electrically connected with the second rounded-corner touch electrode 135 and is located at a side of the touch-driving connection line 145 close to the touch region 101. The second bent portion 3522 is connected with the first extension portion 351 and is located at a side of the touch-driving connection line 145 away from the touch region 101. The first connection portion 3523 connects the first bent portion 3521 with the second bent portion 3522. The first connection portion 3523 is overlapped with the touch-driving connection line 145. In an overlap region of the first connection portion 3523 and the touch-driving connection line 145, the first connection portion 3523 and the touch-driving connection line 145 are arranged in different layers. It should be explained that the above-mentioned first touch electrode is a touch-driving electrode, and the above-mentioned second touch electrode is a touch-sensing electrode; of course, the embodiments of the present disclosure include, but are not limited thereto, the above-mentioned first touch electrode may also be a touch-sensing electrode, and the aforementioned second touch electrode may also be a touch-driving electrode. Each first touch electrode is a touch electrode extending in the second direction, and a plurality of first touch electrodes are arranged in the first direction; each second touch electrode is a touch electrode extending in the first direction, and a plurality of second touch electrodes are arranged in the second direction. In addition, the above-mentioned first direction and the second direction are two directions located in a plane of the touch substrate and are intersected with each other, for example, are perpendicular to each other.

In the touch substrate provided by an embodiment of the present disclosure, the touch-sensing connection line includes a first U-shaped bent portion and a first extension portion extending substantially in the second direction, and the first U-shaped bent portion includes a first bent portion, a second bent portion, and a first connection portion that is arranged in a layer different from the touch-driving connection line, so that the second rounded-corner touch electrode extending into the rounded-corner region can be connected with the first extension portion of a corresponding touch-sensing connection line by using a bridge in the rounded-corner region.

For example, as illustrated in FIG. 6, the touch region 101 may be a rectangle with rounded corners, and the four corners of the touch region 101 are all rounded-corner regions 1015. Of course, the embodiments of the present disclosure include but are not limited thereto, as long as the touch region includes at least one rounded-corner region.

For example, as illustrated in FIG. 6, the first touch electrode 120 and the second touch electrode 130 may be made of the same conductive layer. For example, the second touch electrode 130 may be a continuous electrode extending in the first direction, and the first touch electrode 120 may include a plurality of block-shaped electrodes separated by the second touch electrodes 130 and a plurality of block-shaped electrodes connecting the plurality of block-shaped electrodes. Of course, the embodiments of the present disclosure include but are not limited thereto, and a layout of the first touch electrode and the second touch electrode may refer to a common design.

For example, the first touch electrode 120 and the second touch electrode 130 may be made of a metal material, or a conductive metal oxide such as indium tin oxide.

For example, as illustrated in FIG. 6, the touch substrate 100 further includes a ground line 190 located at a side of the touch-sensing connection wire 350 away from the touch-driving connection line 145 away from the touch region 101.

For example, as illustrated in FIG. 6, the touch substrate 100 further includes a bonding region 398, and the rounded-corner region 1015 is located at a corner of the touch region 101 close to the bonding region 398.

In some exemplary embodiments, as illustrated in FIG. 6, FIG. 7, and FIG. 8, the first bent portion 3521 is substantially parallel with an outer edge of the rounded-corner region 1015, and the second bent portion 3522 is substantially parallel with the outer edge of the rounded-corner region 1015.

In some exemplary embodiments, as illustrated in FIG. 6 and FIG. 7, the first bent portion 3521 of the touch-sensing connection line 350 is spaced apart from the rounded-corner region 1015. The touch-sensing connection line 350 may further include an interconnection portion 353 that electrically connects the first bent portion 3521 of the touch-sensing connection line 350 with the second rounded-corner touch electrode 135. Of course, the embodiments of the present disclosure include but are not limited thereto. As illustrated in FIG. 8, the touch-sensing connection line may not be provided with an interconnection portion, and the first bent portion 3521 is directly connected with the second rounded-corner touch electrode 135. In this case, an orthographic projection of the first bent portion 3521 of the touch-sensing connection line 350 on the base substrate 110 is at least partially overlapped with an orthographic projection of the second rounded-corner touch electrode 135 on the base substrate 110.

In some exemplary embodiments, as illustrated in FIG. 6, FIG. 7, and FIG. 8, the touch substrate 100 further includes a first shielding line 360, and the first shielding line 360 includes a second extension 361 and a second U-shaped bent portion 362. The second U-shaped bent portion 362 includes a third bent portion 3621, a fourth bent portion 3622, and a second connection portion 3623. The third bent portion 3621 is located between the first bent portion 3521 and the touch-driving connection line 145. The fourth bent portion 3622 is located at a side of a touch-driving connection line 145 away from the first bent portion 3521. The second connection portion 3623 connects the third bent portion 3621 with the fourth bent portion 3622. The second connection portion 3623 and the touch-driving connection line 145 are overlapped with and insulated from each other. The second U-shaped bent portion 362 is located in a region enclosed by the first bent portion 3521, the second bent portion 3522 and the first connection portion 3523 that are of the first U-shaped bent portion 352. The first connection portion 3523 and the second connection portion 3623 are substantially parallel with each other, and an opening direction of the second U-shaped bent portion 362 and an opening direction of the first U-shaped bent portion 352 are the same.

The touch substrate provided by this example can prevent from signal interference between the touch-sensing connection line and the touch-driving connection line by providing the above-mentioned first shielding line, thereby avoiding an influence on touch performance. In addition, because the above-mentioned first shielding line includes a second U-shaped bent portion located in a region enclosed by the first bent portion, the second bent portion, and the first connection portion that are of the first U-shaped bent portion, so that a signal interference that occurs between the touch-sensing connection line and the touch-driving connection line can be better prevented, so as to avoid an influence on touch performance.

For example, as illustrated in FIG. 6, the second extension 361 extends substantially in the first direction and is located at a side of the touch-driving connection line 145 away from the touch region 101, thereby preventing from interference to touch-driving connection line 145 caused by external static electricity or electrical signals.

In some exemplary embodiments, as illustrated in FIG. 6 and FIG. 7, the touch substrate further includes a second shielding line 370. An orthographic projection of the second shielding line 370 on the base substrate 110 is located between an orthographic projection of the first shielding line 360 on the base substrate and an orthographic projection of the second bent portion 3522 of the touch-sensing connection line 350 on the base substrate 110. Therefore, the second shielding line can prevent signal interference between the touch-sensing connection line and the external touch-sensing connection line.

In some exemplary embodiments, as illustrated in FIG. 6 and FIG. 7, in the region enclosed by the first U-shaped bent portion 352, an orthographic projection of the touch-driving connection line 145 on the base substrate 110 is located between an orthographic projection of the third bent portion 3621 on the base substrate 110 and an orthographic projection of the fourth bent portion 3622 on the base substrate 110. Therefore, the first shielding line can better prevent from the signal interference between the touch-sensing connection line and the touch-driving connection line, so as to avoid touch performance from being affected by the signal interference between the touch-sensing connection line and the touch-driving connection line.

In some exemplary embodiments, as illustrated in FIG. 6 and FIG. 7, in the region enclosed by the first U-shaped bent portion 352, the touch-driving connection line 145 includes a first touch-driving connection sub-line 1451 located at a side of the second connection portion 3623 away from the first connection portion 3523, and a second touch-driving connection sub-line 1452 located at a side of the first connection portion 3523 away from the second connection portion 3623. The touch substrate 100 further includes a bridge portion 380 connecting the first touch-driving connection sub-line 1451 with the second touch-driving connection sub-line 1452. Thus, by providing the bridge portion 380, the touch-driving connection line 145 can go across the first connection portion 3523 of the first U-shaped bent portion 352 and the second connection portion 3623 of the second U-shaped bent portion 362, and can effectively prevent from signal interference between the first connection portion 3523 and the second connection portion 3623 to the touch-driving connection line 140.

Figure 9:
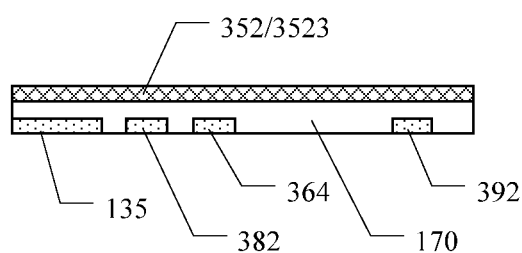
FIG. 9 is a schematic cross-sectional view of a touch substrate illustrated in FIG. 8 taken along line CC and provided by an embodiment of the present disclosure.
Figure 10:
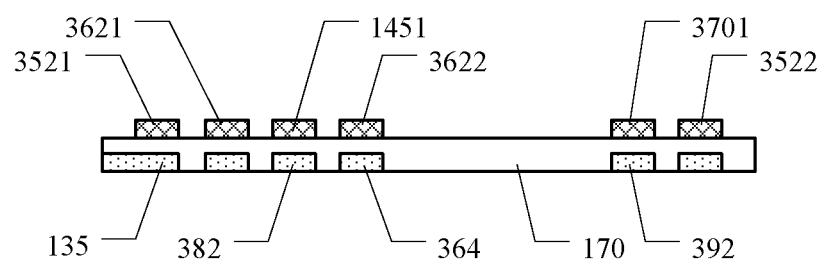
FIG. 10 is a schematic cross-sectional view of a touch substrate illustrated in FIG. 8 taken along line DD and provided by an embodiment of the present disclosure.

FIG. 9 is a schematic cross-sectional view of a touch substrate illustrated in FIG. 8 taken along line CC and provided by an embodiment of the present disclosure. FIG. 10 is a schematic cross-sectional view of a touch substrate illustrated in FIG. 8 taken along line DD and provided by an embodiment of the present disclosure.

In some exemplary embodiments, as illustrated in FIG. 8, FIG. 9, and FIG. 10, the first shielding line 360 further includes: a third extension portion 363 that extends substantially in the second direction; a third connection portion 364 that is located in a layer different from the first connection portion 3523; a first through-hole connection portion 365 that connects the third connection portion 364 with the third extension portion 363; and the second through-hole connection portion 366 that connects the third connection portion 364 with the fourth bent portion 3622. The third connection portion 364 is located in the first conductive layer, the third extension portion 363 and the fourth bent portion 3622 are located in the second conductive layer, an insulation layer 170 is provided between the first conductive layer and the second conductive layer, and the first through-hole connection portion 365 and the second through-hole connection portion 366 are provided in the insulation layer 170. Due to the insulation effect of the insulation layer 170, a parasitic capacitance of a capacitor formed between the third connection portion 364 and the first connection portion 3523 is relatively small, so that the signal interference between the third connection portion 364 and the first connection portion 3523 is weaker, and has less influence on touch effect.

In some exemplary embodiments, as illustrated in FIG. 8, FIG. 9 and FIG. 10, the bridge portion 380 includes: a fourth connection portion 382 arranged in a layer different from the first connection portion 3523; and a third through-hole connection portion 383 that connects the fourth connection portion 382 with the first touch-driving connection sub-line 1451; and a fourth through-hole connection portion 384 that connects the fourth connection portion 382 with the second touch-driving connection sub-line 1452. The fourth connection portion 382 is located in the first conductive layer. The first touch-driving connection sub-line 1451 and the second touch-driving connection sub-line 1452 are located in the second conductive layer, an insulation layer 170 is provided between the first conductive layer and the second conductive layer, and the third through-hole connection portion 383 and the fourth through-hole connection portion 384 are disposed in the insulation layer.

In some exemplary embodiments, as illustrated in FIG. 8, FIG. 9, and FIG. 10, an orthographic projection of the fourth connection portion 382 on the base substrate 110 is overlapped with an orthographic projection of the first touch-driving connection sub-line 1451 on the base substrate 110 and an orthographic projection of the second touch-driving connection sub-line 1452 on the base substrate 110, respectively.

In some exemplary embodiments, as illustrated in FIG. 8, FIG. 9, and FIG. 10, a center of the second through-hole connection portion 366 and a center of the third through-hole connection portion 383 are staggered in the second direction, that is, an orthographic projection of the center of the second through-hole connection portion 366 on the second direction is not overlapped with an orthographic projection of the center of the third through-hole connection portion 383 on the second direction. Thus, when forming the second through-hole connection portion and the third through-hole connection portion as described above, various defects caused by a small distance between via hole position of the second through-hole connection portion and via hole position of the third through-hole connection portion can be avoided.

In some exemplary embodiments, as illustrated in FIG. 8, FIG. 9, and FIG. 10, the third connection portion 364 is located in a first conductive layer, that is, the third connection portion 364 is a part of the first conductive layer, and the first touch-driving connection sub-line 1451 and the second touch-driving connection sub-line 1452 are located in a second conductive layer, that is, the first touch-driving connection sub-line 1451 and the second touch-driving connection sub-line 1452 are parts of the second conductive layer, respectively. An insulation layer 170 is arranged between the first conductive layer and the second conductive layer, and the first through-hole connection portion 365 and the second through-hole connection portion 366 are arranged in the insulation layer 170.

In some exemplary embodiments, as illustrated in FIG. 8, FIG. 9, and FIG. 10, an orthographic projection of the third connection portion 364 on the base substrate 110 is overlapped with an orthographic projection of the fourth bent portion 3622 on the base substrate 110 and an orthographic projection of the third extension portion 363 on the base substrate 110, respectively.

In some exemplary embodiments, as illustrated in FIG. 8, FIG. 9, and FIG. 10, the second shielding line 370 includes a first shielding sub-line 3701 located at a side of the second connection portion 3623 away from the first connection portion 3523 and a second shielding sub-line 3702 located at a side of the first connection portion 3523 away from the second connection portion 3623. The touch substrate 100 further includes a shielding-line bridge-portion 390 connecting the first shielding sub-line 3701 with the second shielding sub-line 3702. Thus, by providing the shielding-line bridge-portion 390, the second shielding line 370 can go across the first connection portion 3523 of the first U-shaped bent portion 352 and the second connection portion 3623 of the second U-shaped bent portion 362, and can further prevent from a signal interference to the touch-driving connection line 140 caused by the second bent portion 3522.

In some exemplary embodiments, as illustrated in FIG. 8, FIG. 9, and FIG. 10, the shielding-line bridge-portion 390 includes: a fifth connection portion 392 that is arranged in a layer different from the first connection portion 3523; and a fifth through-hole connection portion 393 that connects the fifth connection portion 392 with the first shielding sub-line 3701; and a sixth through-hole connection portion 394 that connects the fifth connection portion 392 with the second shielding sub-line 3702. The fifth connection portion 392 is located in a first conductive layer, the first shielding sub-line 3701 and the second shielding sub-line 3702 are located in a second conductive layer, an insulation layer 170 is provided between the first conductive layer and the second conductive layer, the fifth through-hole connection portion 393 and the sixth through-hole connection portion 394 are arranged in the insulation layer.

Similarly, a center of the fifth through-hole connection portion 393, a center of the second through-hole connection portion 366 and a center of the third through-hole connection portion 383 are staggered in the second direction, that is, an orthographic projection of the center of the fifth through-hole connection portion 393 on the second direction and an orthographic projection of the center of the second through-hole connection portion 366 on the second direction are not overlapped with an orthographic projection of the center of the third through-hole connection portion 383 on the second direction, respectively. Therefore, when forming the second through-hole connection portion, the third through-hole connection portion, and the fifth through-hole connection portion, various defects caused by small distances between via hole positions of the second through-hole connection portion, the third through-hole connection portion, and the fifth through-hole connection portion can be avoided.

It should be explained that the first bent portion, the second bent portion, and the touch-driving connection line may all include a connection via structure, and the centers of the connection via structures may also be staggered in the second direction with respect to the center of the fifth through-hole connection portion, the center of the second through-hole connection portion and the center of the third through-hole connection portion, respectively.

In some exemplary embodiments, as illustrated in FIG. 8, FIG. 9, and FIG. 10, an orthographic projection of the fifth connection portion 392 on the base substrate 110 is overlapped with an orthographic projection of the first shielding sub-line 3701 on the base substrate 110 and an orthographic projection of the second shielding sub-line 3702 on the base substrate 110, respectively.

In some exemplary embodiments, the base substrate 110 is a cover plate of a display panel or an encapsulation layer of a display panel. In other words, the display panel can be integrated with the touch substrate, thereby having both touch function and display function.

For example, in the case where the display panel is an organic light-emitting diode (OLED) display panel, the base substrate may be a cover plate or an encapsulation layer of the display panel.

Figure 11:
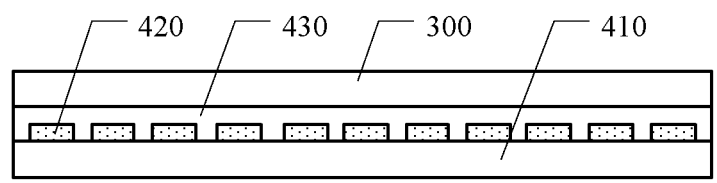
FIG. 11 is a schematic diagram of another touch display device provided by an embodiment of the present disclosure.

An embodiment of the present disclosure further provides a touch display device. FIG. 11 is a schematic diagram of a touch display device provided by an embodiment of the present disclosure. As illustrated in FIG. 11, the touch display device 400 includes the aforementioned touch substrate 300. Therefore, the display device has the same or similar beneficial technical effects as the beneficial effects of the above-mentioned organic light-emitting diode display substrate. For details, please refer to the related description of the embodiments illustrated in FIG. 6, FIG. 7 and FIG. 8, without repeated here.

In some exemplary embodiments, the touch display device 400 further includes a substrate 410, a light-emitting element 420 located on the substrate 410, and an encapsulation layer 430 located at a side of the light-emitting element 420 away from the substrate 410. The aforementioned touch substrate 300 is directly disposed on the encapsulation layer 430, so that a thickness of the touch display device can be reduced, and the touch display device can be lighter and thinner. On the other hand, by directly disposing the aforementioned touch substrate on the encapsulation layer, the touch display device can also be applicable to foldable and bendable electronic products.

For example, the light-emitting element 420 may be an organic light-emitting diode (OLED) light-emitting element.

In some exemplary embodiments, the display device may be an electronic product with a display function such as a mobile phone, a notebook computer, a tablet computer, a navigator, and an electronic photo frame.

The following statements need to be explained:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely particular embodiments of the present disclosure but are not limitative to the scope of the present disclosure; any of those skilled familiar with the related arts can easily conceive variations and substitutions in the technical scopes disclosed by the present disclosure, which should be encompassed in protection scopes of the present disclosure. Therefore, the scopes of the present disclosure should be defined in the appended claims.

What is claimed is:
1. A touch substrate, including:
a base substrate
a plurality of first touch electrodes disposed on the base substrate and arranged in a first direction; and
a plurality of second touch electrodes disposed on the base substrate and arranged in a second direction,
wherein the touch substrate includes a touch region and a peripheral region located at a periphery of the touch region, and the touch region includes a rounded-corner region,
the plurality of first touch electrodes include at least one first rounded-corner touch electrode extending into the rounded-corner region, the touch substrate further includes a touch-driving connection line connected with each of the at least one first rounded-corner touch electrode, the plurality of second touch electrodes include at least one second rounded-corner touch electrode extending into the rounded-corner region,
the touch substrate further includes a touch-sensing connection line connected with each of the at least one second rounded-corner touch electrode, the touch-sensing connection line includes a first U-shaped bent portion and a first extension portion extending in the second direction, the first U-shaped bent portion includes a first bent portion, a second bent portion, and a first connection portion, the first bent portion is electrically connected with the second rounded-corner touch electrode and located at a side of the touch-driving connection line close to the touch region, the second bent portion is connected with the first extension portion and located at a side of the touch-driving connection line away from the touch region, and the first connection portion connects the first bent portion with the second bent portion, and
the first connection portion and the touch-driving connection line are overlapped with each other in a direction perpendicular to the base substrate, and, in an overlap region of the first connection portion and the touch-driving connection line, the first connection portion and the touch-driving connection line are arranged in different layers.

2. The touch substrate according to claim 1, wherein the touch-sensing connection line further includes:
an interconnection line electrically connecting the first bent portion and the second rounded-corner touch electrode.

3. The touch substrate according to claim 1, further including:
a first shielding line, including a second U-shaped bent portion and a second extension portion,
wherein the second U-shaped bent portion includes a third bent portion located between the first bent portion and the touch-driving connection line, a fourth bent portion located at a side of the touch-driving connection line away from the first bent portion, and a second connection portion connecting the third bent portion with the fourth bent portion, the second connection portion and the touch-driving connection line are overlapped with each other and are insulated from each other, and
the second U-shaped bent portion is located in a region enclosed by the first bent portion, the second bent portion, and the first connection portion, the first connection portion and the second connection portion are substantially parallel with each other, the second U-shaped bent portion and the first U-shaped bent portion have a same opening direction.

4. The touch substrate according to claim 3, further including:
a second shielding line, wherein
an orthographic projection of the second shielding line on the base substrate is located between an orthographic projection of the first shielding line on the base substrate and an orthographic projection of the second bent portion on the base substrate.

5. The touch substrate according to claim 3, wherein the first bent portion is substantially parallel with an outer edge of the rounded-corner region, and the second bent portion is substantially parallel with an outer edge of the rounded-corner region.

6. The touch substrate according to claim 3, wherein the touch-driving connection line includes a first touch-driving connection sub-line located at a side of the second connection portion away from the first connection portion and a second touch-driving connection sub-line located at a side of the first connection portion away from the second connection portion, and the touch substrate further includes a bridge portion connecting the first touch-driving connection sub-line with the second touch-driving connection sub-line.

7. The touch substrate according to claim 1, further including:
    a second shielding line, wherein
    an orthographic projection of the second shielding line on the base substrate is located between an orthographic projection of the first shielding line on the base substrate and an orthographic projection of the second bent portion on the base substrate.

8. The touch substrate according to claim 1, wherein the first bent portion is substantially parallel with an outer edge of the rounded-corner region, and the second bent portion is substantially parallel with an outer edge of the rounded-corner region.

9. The touch substrate according to claim 1, wherein the touch-driving connection line includes a first touch-driving connection sub-line located at a side of the second connection portion away from the first connection portion and a second touch-driving connection sub-line located at a side of the first connection portion away from the second connection portion, and the touch substrate further includes a bridge portion connecting the first touch-driving connection sub-line with the second touch-driving connection sub-line.

10. The touch substrate according to claim 9, wherein the first shielding line further includes:
    a third extension portion extending substantially in the second direction;
    a third connection portion arranged in a layer different from the first connection portion;
    a first through-hole connection portion connecting the third connection portion with the third extension portion; and
    a second through-hole connection portion connecting the third connection portion with the fourth bent portion,
    wherein the third connection portion is located in a first conductive layer, the third extension portion and the fourth bent portion are located in a second conductive layer, and an insulation layer is provided between the first conductive layer and the second conductive layer, and the first through-hole connection portion and the second through-hole connection portion are provided in the insulation layer.

11. The touch substrate according to claim 10, wherein an orthographic projection of the third connection portion on the base substrate is overlapped with an orthographic projection of the fourth bent portion on the base substrate and an orthographic projection of the third extension portion on the base substrate, respectively.

12. The touch substrate according to claim 11, wherein an orthographic projection of the fourth connection portion on the base substrate is overlapped with an orthographic projection of the first touch-driving connection sub-line on the base substrate and an orthographic projection of the second touch-driving connection sub-line on the base substrate, respectively.

13. The touch substrate according to claim 11, wherein a center of the second through-hole connection portion and a center of the third through-hole connection portion are staggered in the second direction.

14. The touch substrate according to claim 10, wherein the bridge portion includes:
    a fourth connection portion arranged in a layer different from the first connection portion;
    a third through-hole connection portion connecting the fourth connection portion with the first touch-driving connection sub-line; and
    a fourth through-hole connection portion connecting the four connection portion with the second touch-driving connection sub-line,
    wherein the fourth connection portion is located in the first conductive layer, the first touch-driving connection sub-line and the second touch-driving connection sub-line are located in the second conductive layer, and an insulation layer is provided between the first conductive layer and the second conductive layer, and the third through-hole connection portion and the fourth through-hole connection portion are arranged in the insulation layer.

15. The touch substrate according to claim 1, further including:
    a ground line located at a side of the second bent portion away from the touch region.

16. The touch substrate according to claim 1, wherein the base substrate is a cover plate of a display panel or an encapsulation layer of a display panel.

17. The touch substrate according to claim 1, wherein the first touch electrode is a touch-driving electrode, and the second touch electrode is a touch-sensing electrode.

18. The touch substrate according to claim 1, further including:
    a bonding region,
    wherein the rounded-corner region is located at a corner of the touch region close to the bonding region.

19. A touch display device including the touch substrate according to claim 1.

* * * * *